United States Patent
Yuan et al.

(10) Patent No.: US 7,922,513 B2
(45) Date of Patent: Apr. 12, 2011

(54) ZIF SOCKET HAVING REINFORCED COVER PREVENTING BREAKAGE DURING MANEUVERING

(75) Inventors: Pei-Liang Yuan, Shenzhen (CN); Fu-Jin Peng, Shenzhen (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/574,711

(22) Filed: Oct. 7, 2009

(65) Prior Publication Data

US 2010/0087081 A1    Apr. 8, 2010

(30) Foreign Application Priority Data

Oct. 7, 2008 (CN) .......................... 2008 2 0302349

(51) Int. Cl.
  *H01R 13/625* (2006.01)
(52) U.S. Cl. ........................................ 439/342; 439/265

(58) Field of Classification Search ................... 439/342, 439/259, 265
See application file for complete search history.

(56) References Cited

U.S. PATENT DOCUMENTS

| 6,712,634 | B1 * | 3/2004 | McClinton ..................... 439/342 |
| 6,733,321 | B2 | 5/2004 | Okita et al. |
| 6,910,908 | B2 * | 6/2005 | Tran et al. ..................... 439/342 |
| 7,108,536 | B2 * | 9/2006 | Yu et al. ....................... 439/342 |

* cited by examiner

*Primary Examiner* — Truc T Nguyen
(74) *Attorney, Agent, or Firm* — Andrew C. Cheng; Wei Te Chung; Ming Chieh Chang

(57) ABSTRACT

An electrical connector includes a base having a number of passageways and a compartment in one end thereof. A cover is mounted to the base. The cover has a plurality of through holes corresponding to the passageways and a driving compartment corresponding to the compartment. The driving compartment has one single-step stopper. One recess is positioned adjacent the stopper and receives a stiffener therein for supporting the stopper. A cam is disposed in the driving compartment and the compartment to drive the cover moving relative to the base along a front-to-back direction.

10 Claims, 6 Drawing Sheets

ZIF SOCKET HAVING REINFORCED COVER PREVENTING BREAKAGE DURING MANEUVERING

BACKGROUND OF THE INVENTION

1. Field of the Invention

The present invention relates to an electrical connector, and more particularly to an electrical connector having an reinforced cover providing enough strength to prevent the cover from being damaged during a cam rotated to abut against the cover.

2. Description of the Prior Art

Electrical connectors are typically used to electrically connect a first electrical component, such as an electronic package and a second electrical component, such as a printed circuit board. The electrical connector comprises substantially three types according to terminals of the electronic package. U.S. Pat. No. 6,733,321 issued to Okita et al. on May 11, 2004 discloses a zero insertion force (ZIF) socket that connects pin leg terminals of the electronic package. Okita discloses the ZIF socket includes an insulative base, a cover slidably mounted on the base, an actuator rotatably mounted between the base and the cover, and multiplicity of contacts received in the base for electrically connecting pin legs of the electronic package. The cover defines a multiplicity of holes for receiving the pin legs of the electronic package. The cover has a platform defined a step-shaped compartment for receiving the actuator therein. The compartment defines two single-step braking sections. A metal washer is mounted in the compartment for reducing frictional force and preventing the plastic walls of the driving compartments from being damaged when the actuator is rotated.

In the ZIF socket disclosed above, the braking sections of the driving compartments are needed to abut against the actuator so that there is a possibility that the braking section will damaged by the actuator.

Therefore, it is need to find a new electrical connector having an improved cover to overcome the problems mentioned above.

SUMMARY OF THE INVENTION

Accordingly, an object of the present invention is to provide an electrical connector with an reinforced cover for providing rigidity strength to prevent a cover from being damaged during a cam rotated to abut against the cover.

In order to achieve the object set forth, an electrical connector comprises a base having a plurality of passageways and a compartment in one end thereof. A cover is mounted to the base. The cover has a plurality of through holes corresponding to the passageways and a driving compartment corresponding to the compartment. The driving compartment has one single-step stopper. At least one recess is defined adjacent the stopper and receives a stiffener therein for supporting the stopper. A cam is disposed in the driving compartment and the compartment to drive the cover moving relative to the base along a front-to-back direction.

In order to further achieve the object set forth, an electrical connector comprises a base having a plurality of passageways and a compartment in one end thereof. A cover is mounted to the base and has a plurality of through holes corresponding to the passageways. The cover has a driving compartment corresponding to the compartment and a stopper disposed on a sidewall of the driving compartment. A cam is disposed in the driving compartment and the compartment adapted for driving the cover moving relative to the base along a front-to-back direction. A stiffener is disposed at a front side of the stopper for increasing a strength for the stopper to prevent the cover from being damaged.

DESCRIPTION OF PREFERRED EMBODIMENT

Reference will now be made to the drawings to describe the present invention in detail.

Figure 1:
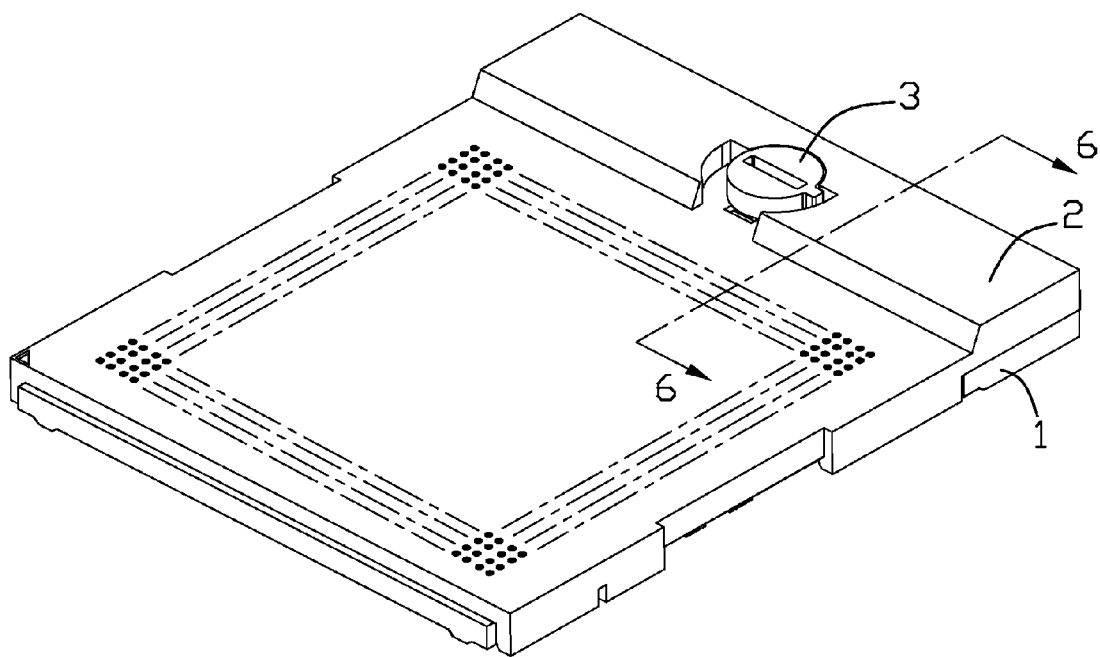
FIG. 1 is an assembled perspective view of an electrical connector according to the present invention.
Figure 2:
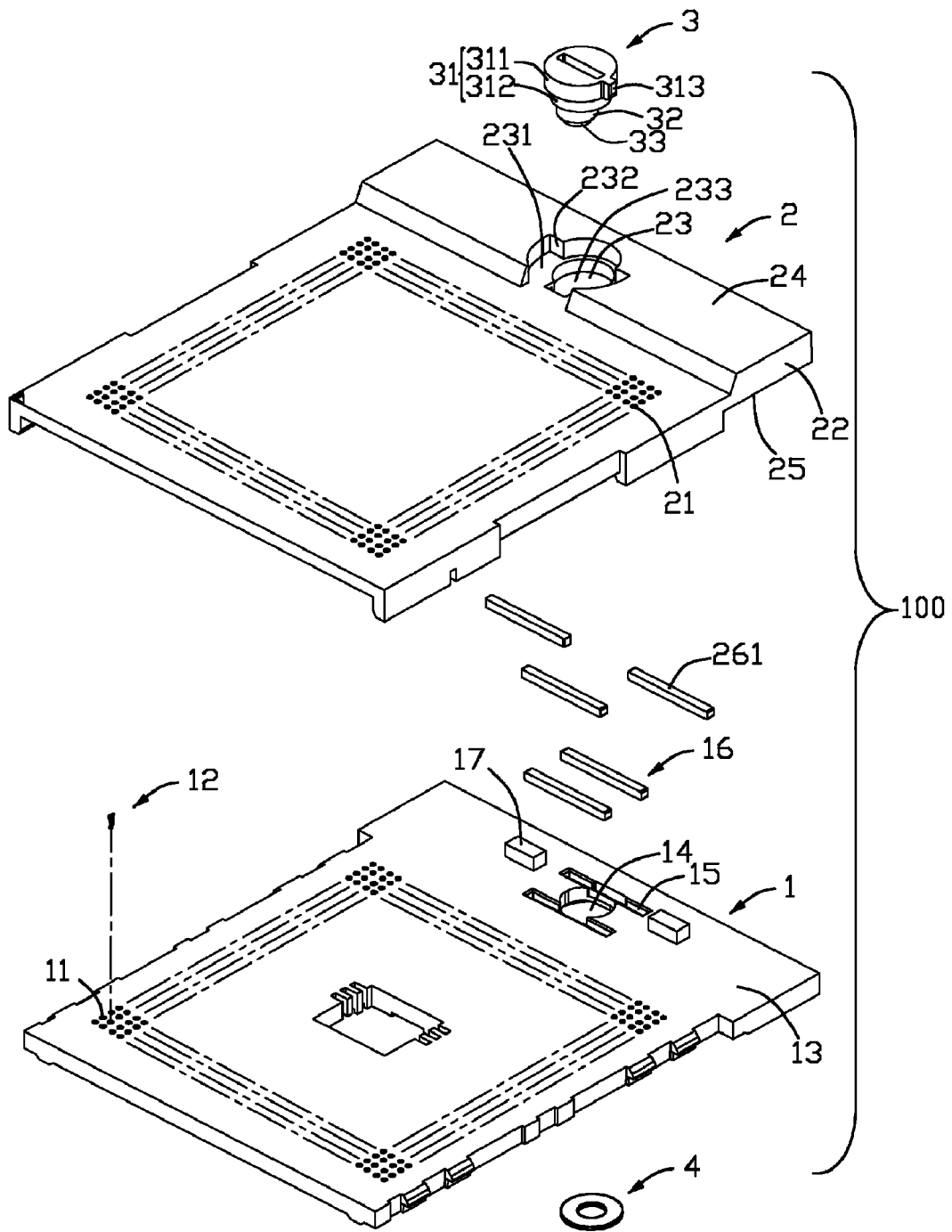
FIG. 2 is an exploded perspective view of the electrical connector of FIG. 1.

Referring to FIG. 1 and FIG. 2, an electrical connector 100 made in accordance with present invention comprises a base 1 and a cover 2 slidably mounted upon the base 1. The base 1 has substantially rectangular configuration and defines a plurality of passageways 11 extending therethrough. A plurality of contacts 12 are received in the passageways 11 for electrical connecting a first electrical component (not shown) with a second electrical component (not shown). The base 1 includes a cover platform 13 defined a compartment 14 in a middle thereof. A pair of channels 15 is defined at opposite sides of the compartment 14 and communicates therewith for receiving two metallic ribs 16 therein. A pair of tabs 17 are disposed on the platform 13 and are located adjacent to the compartment 14 in a right and a left direction. The cover 2 defines a step-shaped driving compartment 23 corresponding to the compartment 14 for receiving an upper section of a cam 3 that is another element provided by the electrical connector 100. A shaft of the cam 3 is also received in the compartment 14 and engages with the metallic rib 16 with smooth surface for reducing friction therebetween.

Figure 6:
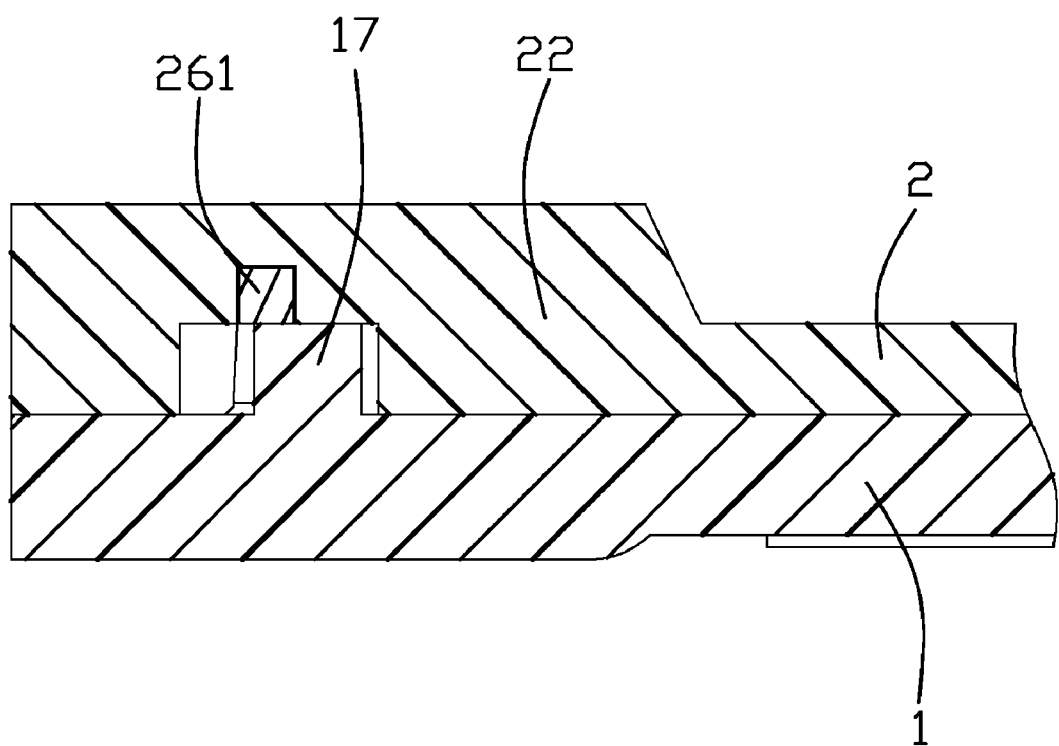
FIG. 6 is a partial cross sectional view of take along line 6-6 of FIG. 1.

Referring to FIG. 2-5, the cover 2 is used for supporting the first electrical component and has a plurality of through holes 21 corresponding to the passageways 11 of the base 1. The cover 2 has a platform 22 corresponding to the platform 13 of the base 1 and the step-shaped driving compartment 23 is defined on the platform 22. The driving compartment 23 includes a larger hole 231 in an upper portion and a smaller hole 233 in a bottom portion thereof. The larger hole 231 is formed with two different semicircles and two single-step stoppers 232 are defined thereon. Two recesses 26 are defined in a bottom surface 25 of the cover 2 for accommodating a stiffener 261 with a corresponding shape to the recesses 26. The recesses 26 are located adjacent to the single-step stoppers 232 and located at a front side of the stopper for increasing the strength of the single-step stoppers 232 and preventing single-step stoppers 232 from being damaged by the cam 3. A notch 27 is defined on a side of each recess 26 and communicates with the recess 26, for receiving the tabs 17 of the base 1. Referring to FIG. 6, in the present invention, a depth of the notch 27 is smaller than a depth of the recess 26 so that the tab 17 in the notch 27 can press the stiffener 261 in the recess 26 for supporting the stiffener 26. The tabs 17 are moved in the notch 27 along a front-to-back direction when the cover 2 slides relative to the base 1 driven by the cam 3 and the notch 27 can limit a distance that the cover 2 slide relative to the base 1.

Figure 3:
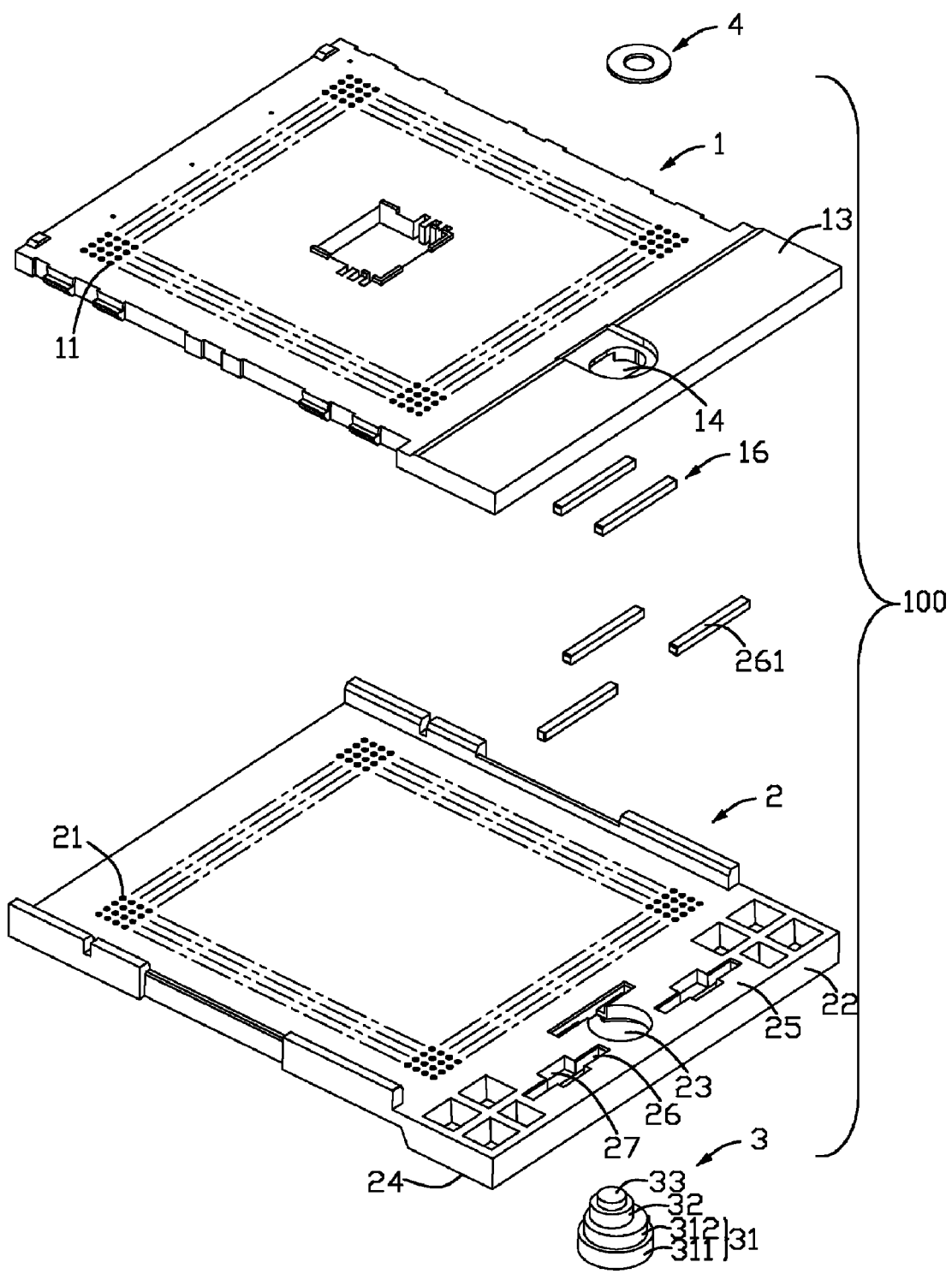
FIG. 3 is another exploded perspective view of the electrical connector of FIG. 1.
Figure 4:
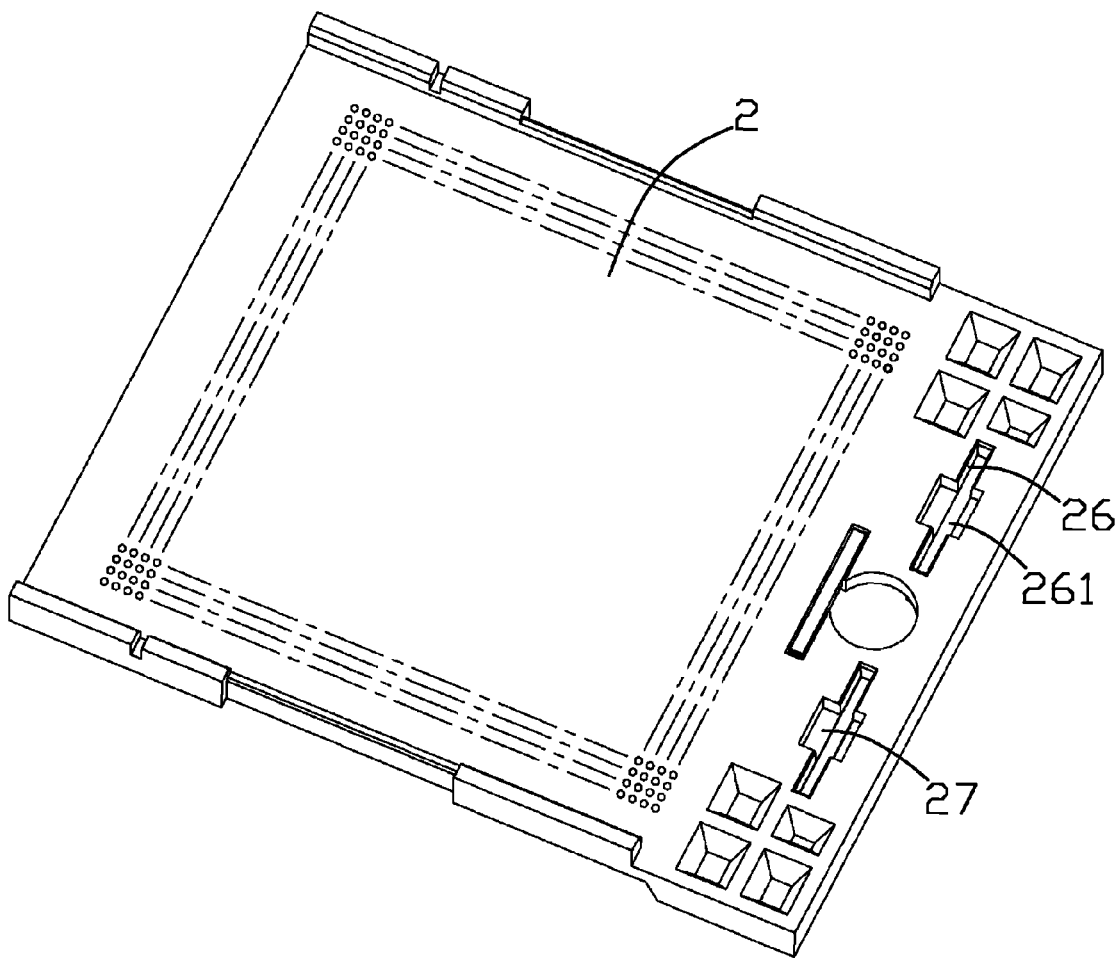
FIG. 4 is a perspective view showing two stiffeners assembled to the cover of the electrical connector shown in FIG. 3.
Figure 5:
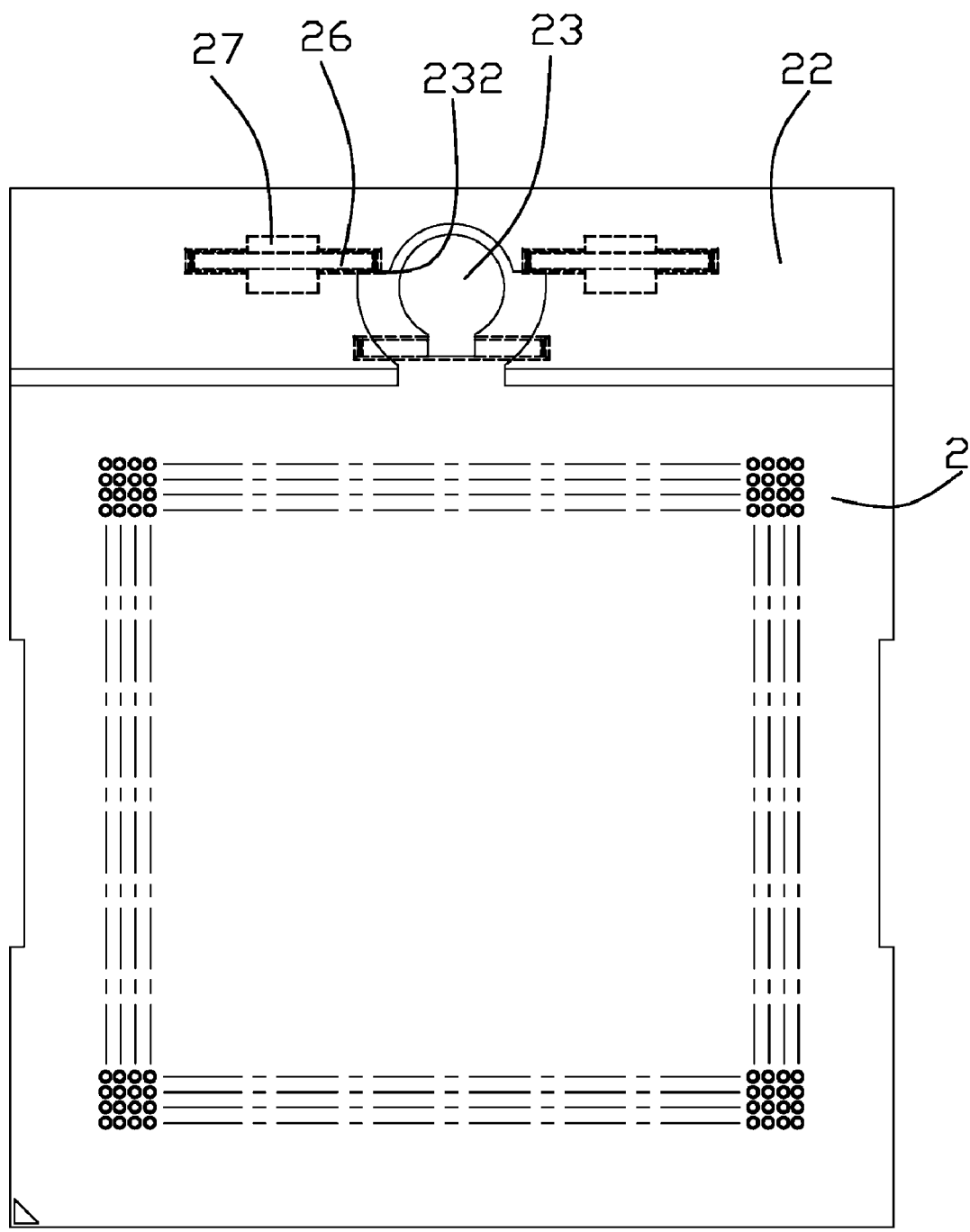
FIG. 5 is a top view of FIG. 4.

Referring to FIG. 3, the cam 3 includes a plurality of post with different diameters and comprises an actuating section 31, a securing section 33, and a linking section 32 connecting the actuating section 31 and the securing section 33. The cam 3 has two different axises, the linking section 32 and the securing section 33 have a same axis that is parallel to the actuating section 31. The actuating section 31 is received in the driving compartment 23, the linking portion 32 is received in the compartment 14, and the securing section 33 is riveted with a clip 4. In addition, the actuating section 31 is further divided into a top section 311 and a bottom section 312, the top section 311 is positioned in the larger hole 231, and the bottom section 312 is positioned in the smaller hole 233. A blocking section 313 is disposed on the top section 311 for engaging with the stoppers 232 on of the cover 2. When the cam 3 is rotated in a substantially 180 degrees, the cover 2 is driven to move relative to the base 1 in a horizontal direction. Because the stiffeners 261 are arranged adjacent to the stoppers 232 of the cover 2 thereby providing increased and reinforced rigidity to the cover 2 for protecting the stoppers 232 from being damaged by the blocking section 313.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector, comprising:
a base having a plurality of passageways and a compartment in one end thereof;
a cover mounted to the base, the cover having a plurality of through holes corresponding to the passageways and a driving compartment corresponding to the compartment, the driving compartment having one single-step stopper and at least one recess positioned adjacent the stopper and receiving a stiffener therein for supporting the stopper;
a cam disposed in the driving compartment and the compartment to drive the cover moving relative to the base along a front-to-back direction;
wherein a blocking section extends from the cam and abut against the stopper to limit the rotation of the cam;
wherein a tab extends upwardly from the base;
and a notch is defined on a side of a recess of the cover and is in communication with the recess for receiving the tab of the base;
and wherein a depth of the notch is smaller than dept of the recess so that the tab in the notch can support the stiffener.

2. The electrical connector as claim in claim 1, wherein the recess is arranged at a bottom surface of the cover and substantially formed with a rectangular strip.

3. The electrical connector as claimed in claim 1, wherein the tab is moved in the notch along the front-to-back direction when the cover slide relative to the base and the notch can limit a distance that the cover slides relative to the base.

4. The electrical connector as claimed in claim 1, wherein the driving compartment is a step-shaped hole and comprises a larger hole in an upper portion and a smaller hole in a bottom portion, and the stopper is formed by the larger hole and the smaller hole.

5. An electrical connector, comprising:
a base having a plurality of passageways and a compartment in one end thereof;
a cover mounted to the base and having a plurality of through holes corresponding to the passageways, the cover having a driving compartment corresponding to the compartment and two stoppers disposed on a sidewall of the driving compartment;
a cam disposed in the driving compartment and the compartment adapted for driving the cover moving relative to the base along a front-to-back direction; and
a first stiffener disposed at a front side of the stoppers for engaging with the cam, and
two second stiffeners respectively disposed at a back side of the two stoppers;
wherein a blocking section extends from the cam and abut against the stopper to limit the rotation of the cam;
wherein a tab extends upwardly from the base; and
a notch is defined on a side of a recess of the cover and is in communication with the recess for receiving the tab of the base;
and wherein a depth of the notch is smaller than dept of the recess so that the tab in the notch can support the second stiffeners.

6. The electrical connector as claimed in claim 5, wherein a recess is arranged near the stopper at a bottom surface of the cover and the stiffener is located in the recess.

7. The electrical connector as claimed in claim 6, wherein the driving compartment is a step-shaped hole and comprises a larger hole in an upper portion and a smaller hole in a bottom portion, and the stopper is defined by the larger hole and the smaller hole.

8. The electrical connector as claimed in claim 7, wherein the cam includes a plurality of post with different diameters and comprises an actuating section, a securing section, and a linking section connecting the actuating section and the securing section.

9. The electrical connector as claimed in claim 8, wherein the cam has two different axises, the linking section and the securing section have a same axis that is parallel to the axis of the actuating section.

10. The electrical connector as claimed in claim 9, wherein the actuating section is received in the driving compartment, the linking portion is received in the compartment, and the securing section is riveted with a clip; and the actuating section is further divided into a top section and a bottom section, the top section is positioned in the larger hole and the bottom section is positioned in the smaller hole.

\* \* \* \* \*